US012633917B2

(12) United States Patent
Gwynne

(10) Patent No.: US 12,633,917 B2
(45) Date of Patent: May 19, 2026

(54) ISOLATED GATE DRIVER

(71) Applicant: QUANTUM POWER TRANSFORMATION LIMITED, Cambridge (GB)

(72) Inventor: Robert William Gwynne, Cambridge (GB)

(73) Assignee: Quantum Power Transformation Limited, Cambridge (GB)

( * ) Notice: Subject to any disclaimer, the term of this patent is extended or adjusted under 35 U.S.C. 154(b) by 40 days.

(21) Appl. No.: 18/575,015

(22) PCT Filed: Jun. 29, 2022

(86) PCT No.: PCT/GB2022/051680
§ 371 (c)(1),
(2) Date: Dec. 28, 2023

(87) PCT Pub. No.: WO2023/275551
PCT Pub. Date: Jan. 5, 2023

(65) Prior Publication Data
US 2024/0356546 A1 Oct. 24, 2024

(30) Foreign Application Priority Data

Jun. 30, 2021 (GB) ..................................... 2109456

(51) Int. Cl.
*H02M 1/08* (2006.01)
*H03K 3/012* (2006.01)
*H03K 17/691* (2006.01)
(52) U.S. Cl.
CPC ............ *H03K 17/691* (2013.01); *H02M 1/08* (2013.01); *H03K 3/012* (2013.01); *H03K 2217/0081* (2013.01)

(58) Field of Classification Search
CPC ....... H02M 1/08; H03K 3/012; H03K 17/691; H03K 2217/0081
(Continued)

(56) References Cited

U.S. PATENT DOCUMENTS 9,608,623 B1* 3/2017 Kandah .............. G01R 19/0084
9,673,809 B1* 6/2017 Kandah ................ H03K 17/691
(Continued)

OTHER PUBLICATIONS

PCT/GB2022/051680, "International Search Report and Written Opinion", issued by the European Patent Office, as International Searching Authority on Sep. 9, 2022, 10 pages.
(Continued)

*Primary Examiner* — William Hernandez
(74) *Attorney, Agent, or Firm* — Kilpatrick Townsend & Stockton LLP

(57) ABSTRACT

Described is circuitry (200) for driving a power switching device (226), the circuitry (200) comprising: a control circuit (211) in a first power domain configured to generate a first power domain PWM pulse signal (208a, 208b, 208c, 208d) in response to received PWM pulse data (207a, 207b, 207c, 207d) that encodes a PWM waveform, the first power domain PWM pulse signal (208a, 208b, 208c, 208d) being synchronous with a system clock signal (210); an isolation coupler (214, 218a, 218b, 218c, 218d) between the first power domain and a second power domain configured to generate a second power domain PWM pulse signal (209a, 209b, 209c, 209d) in response to the first power domain PWM pulse signal (208a, 208b, 208c, 208d); and a drive circuit (212) in the second power domain configured to drive the power switching device (226) with a voltage input (201, 202, 203, 225) in response to the second power domain PWM pulse signal (209a, 209b, 209c, 209d).

19 Claims, 3 Drawing Sheets

(58) Field of Classification Search
USPC ................................................ 327/108, 109
See application file for complete search history.

(56) References Cited

U.S. PATENT DOCUMENTS

| | | | |
|---|---|---|---|
| 11,183,452 B1 * | 11/2021 | Mueller-Meskamp | ...................... H01L 21/76283 |
| 11,799,466 B2 * | 10/2023 | Bang ................ | H03K 17/08122 |
| 2009/0309643 A1 | 12/2009 | Suzuki et al. | |
| 2018/0013424 A1 | 1/2018 | Uchida et al. | |
| 2021/0313801 A1 * | 10/2021 | Albertini ............. | H02M 1/0006 |

OTHER PUBLICATIONS

Search Report under Section 17(5) of Patents Act 1977 issued by the United Kingdom Intellectual Property Office for application No. GB 2109456.0 on Mar. 22, 2022, 4 pages.

PCT/GB2022/051680, "Informal Comments in response to the International Search Report and Written Opinion," for application No. PCT/GB2022/051680 dated Oct. 7, 2022, 4 pages.

* cited by examiner

300

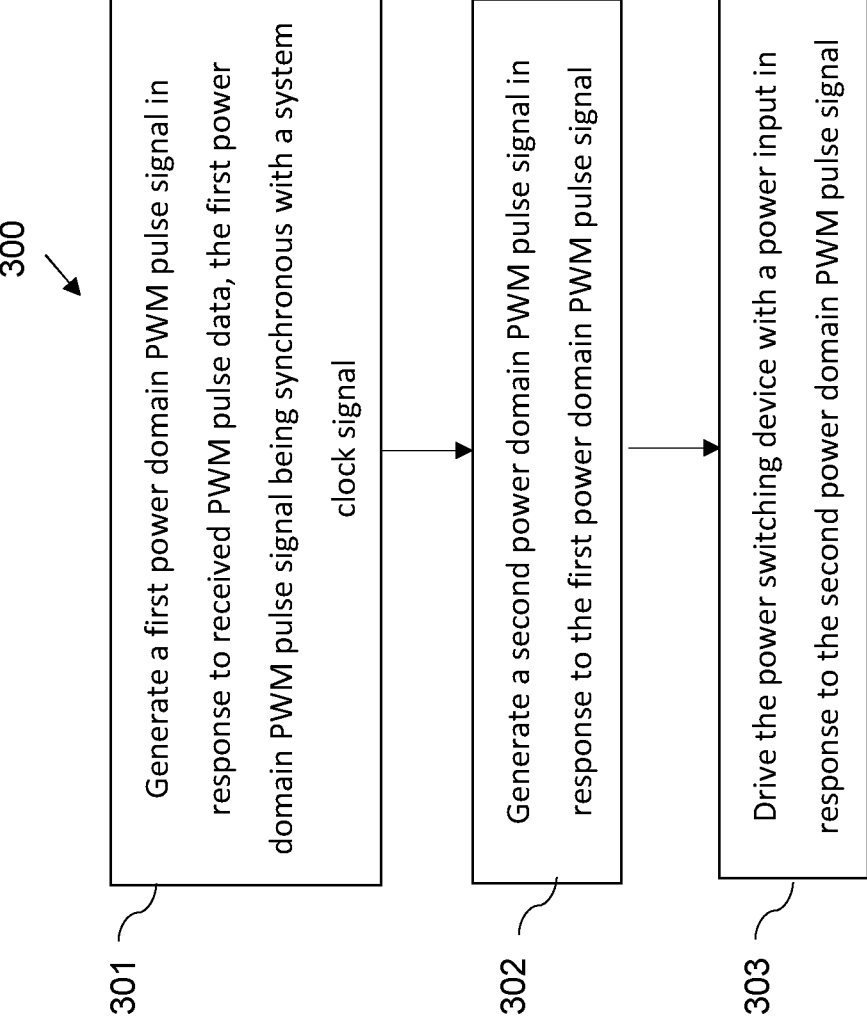

301 Generate a first power domain PWM pulse signal in response to received PWM pulse data, the first power domain PWM pulse signal being synchronous with a system clock signal 302 Generate a second power domain PWM pulse signal in response to the first power domain PWM pulse signal 303 Drive the power switching device with a power input in response to the second power domain PWM pulse signal

Figure 3

ISOLATED GATE DRIVER

CROSS-REFERENCES TO RELATED APPLICATIONS

This application is a National Stage of PCT Application No. PCT/GB2022/051680, filed Jun. 29, 2022, which claims the benefit of and the priority to GB Application No. 2109456.0, filed on Jun. 30, 2021, which are hereby incorporated by reference in their entireties for all purposes.

FIELD OF THE INVENTION

This invention relates to an isolated gate driver, for example for driving field effect transistors.

BACKGROUND

High voltage power switching devices, such as transistors, in particular field effect transistors (FETs), may be driven by a low voltage logic circuit. Voltage isolation may be used to improve the safety of the circuits. It is known to drive the high voltage power transistors using opto-isolators and various types of semiconductor devices.

A problem with existing devices is that they may introduce significant amounts of jitter, or deviation from the clock signal, into the digital signals. For digitally controlled power converters, such as those of the prior art, with slow switching speeds, having a significant amount of jitter may not provide significant issues. However, at high switching speeds, the jitter can become a more significant issue. Prior art digitally controlled power converters may have switching speeds in the range of 10 to 1000 KHz. At this switching speed, the PWM signals, used to drive the transistors, may be around 1 us long and the around 100-200 ps of jitter that the device introduces may only represent a very small error.

For example, a 100 ps error in a digital signal at a 1 MHz switching speed represents 1e-6/100e-12=1e-4, or 1 part in 10,000. This represents a system resolution of 13 bits, which has been acceptable for previous high voltage power applications.

With the advent of faster power FETs, such as silicon carbide (SiC) devices and more recently gallium nitride (GaN) devices, switching speeds in the range of 10 to 100 MHz may be achieved. These higher switching speed devices may enable the power converters to be made smaller, cheaper, more responsive and more fault tolerant.

However, these benefits may only be realised if the control circuit and the drive circuit can match the switching speed of the transistors. For example, with the above example of 100 ps of jitter, at a 20 MHz switching speed, the system resolution would reduce to 1 part in 500. The represents a resolution of 9 bits. This is no longer acceptable in current implementations where a resolution of 16 to 20 bits may be required. Therefore, the control circuit and the drive circuit may now be the limiting factor in high-speed high voltage power applications.

FIG. 1 schematically illustrates a circuitry for driving a power switching device of the prior art.

In the circuitry 100 of the prior art, input data 101 may be inputted into the register 103 along with a local clock signal 103. The input data 101 may also be inputted into the pulse generator/modulator 104 along with the local clock signal 103. The generated signals are then passed through an isolation transformer 105 into a demodulator 106. The demodulator 106 generates output data 107.

The input data 101 is asynchronous to the internal logic of the circuitry 100. As the circuitry 100 reacts to the rise or fall of logic signals at its input, the circuitry 100 must synchronise these signals to its internal pulse generating logic. This logic needs to be timed by a local clock 102.

The upper frequency of the local clock 102 may have physical and commercial limitations, due to the integrated circuit (IC) fabrication technology and the cost of implementation which increases with increasing clock speed.

As described herein, even with a 10 GHz internal clock, the jitter introduced by synchronising the asynchronous input data 101 to the internal clock 102 will be of the order of the clock period, or 100 ps peak to peak.

The fastest prior art circuitry may pass 2.5 GHz low voltage differential signaling (LVDS) signals, but still have a jitter of 40-60 ps, due to the inherent problem of synchronising the asynchronous input data 101 with the local clock 102. Furthermore, this prior art circuitry 100 only comprises logic circuitry. In other words, the circuitry only passes LVDS level signals and would have to be combined with an isolated DC-DC power supplies and other circuitry to drive a power switching device.

Prior art circuitry that includes circuitry to drive a power switching device have far higher additive jitter.

It is desirable to develop circuitry and a method that overcomes the above problems.

SUMMARY

According to a first aspect there is provided circuitry for driving a power switching device, the circuitry comprising: a control circuit in a first power domain configured to generate a first power domain PWM pulse signal in response to received PWM pulse data that encodes a PWM waveform, the first power domain PWM pulse signal being synchronous with a system clock signal; an isolation coupler between the first power domain and a second power domain configured to generate a second power domain PWM pulse signal in response to the first power domain PWM pulse signal; and a drive circuit in the second power domain configured to drive the power switching device with a voltage input in response to the second power domain PWM pulse signal.

In some implementations, the circuitry may be arranged wherein the control circuit is configured to generate the PWM pulse data by encoding input command data, the input command data comprising a numerical representation of the PWM duty cycle.

In some implementations, the circuitry may be arranged wherein the PWM pulse data comprises ON data sets representing an ON PWM waveform and OFF data sets representing an OFF PWM waveform.

In some implementations, the circuitry may be arranged wherein the ON data sets comprise an ON_START data set representing a start time of the ON PWM waveform and an ON_END data set representing an end time of the ON PWM waveform, and the OFF data sets comprise an OFF_START data set representing a start time of the OFF PWM waveform and an OFF_END data set representing an end time of the OFF PWM waveform.

In some implementations, the circuitry may be arranged wherein the control circuit is configured to generate a plurality of first power domain PWM pulse signals, each first power domain PWM pulse signal being generated in response to a corresponding PWM pulse data set.

In some implementations, the circuitry may be arranged wherein the isolation coupler is configured to generate a plurality of second power domain PWM pulse signals, each second power domain PWM pulse signal being generated in response to a corresponding first power domain PWM pulse signal.

In some implementations, the circuitry may be arranged wherein the isolation coupler comprises at least one transformer.

In some implementations, the circuitry may be arranged wherein the isolation coupler comprises one transformer for generating each second power domain PWM pulse signal.

In some implementations, the circuitry may be arranged wherein the drive circuit is configured to drive the power switching device with the voltage input in response to the plurality of second power domain PWM pulse signals.

In some implementations, the circuitry may be arranged wherein the drive circuit comprises an ON gate, the ON gate closing in response to an ON_START second power domain PWM pulse signal and opening in response to an ON_END second power domain PWM pulse signal.

In some implementations, the circuitry may be arranged wherein the drive circuit comprises an OFF gate, the OFF gate closing in response to an OFF_START second power domain PWM pulse signal and opening in response to an OFF_END second power domain PWM pulse signal.

In some implementations, the circuitry may be arranged wherein the voltage input to the power switching device increases in response to the ON gate closing.

In some implementations, the circuitry may be arranged wherein the voltage input to the power switching device decreases in response to the OFF gate closing.

In some implementations, the circuitry may be arranged wherein the control circuit is configured to receive a first power domain voltage input, the isolation coupler is configured to generate a second power domain voltage input in response to the first power domain voltage input, and the drive circuit is configured to generate a power switching device voltage input from the second power domain voltage input, the power switching device voltage input being used to drive the power switching device.

In some implementations, the circuitry may be arranged wherein the second power domain comprises a first sub-power domain and a second sub-power domain.

In some implementations, the circuitry may be arranged wherein the ON gate is located in the first sub-power domain and the OFF gate is located in the second sub-power domain.

In some implementations, the circuitry may be arranged wherein the circuitry comprises a plurality of power switching devices driven by the drive circuit.

In some implementations, the circuitry may be arranged wherein the power switching device comprises a transistor.

In some implementations, the circuitry may be arranged wherein the power switching device comprises a field effect transistor.

According to a second aspect there is provided a power converter assembly comprising a power converter driven by the circuitry of any preceding claim.

According to a third aspect there is provided an electric motor assembly comprising an electric motor driven by the circuitry of any preceding claim.

According to a fourth aspect there is provided a method for driving a power switching device, the method comprising: generating a first power domain PWM pulse signal in response to received PWM pulse data, the first power domain PWM pulse signal being synchronous with a system clock signal; generating a second power domain PWM pulse signal in response to the first power domain PWM pulse signal; and driving the power switching device with a voltage input in response to the second power domain PWM pulse signal.

BRIEF DESCRIPTION OF THE FIGURES

The present invention will now be described by way of example with reference to the accompanying drawings. In the drawings:

FIG. 3 illustrates an exemplary embodiment of a flow chart of a method for driving a power switching device.

DETAILED DESCRIPTION

The circuitry and method described herein concern driving a power switching device.

High speed power switching devices, such as devices with switching speeds in the range of 10 to 100 MHz, require isolation technology with minimal additive jitter. Preferably, the additive jitter is in the picosecond regime in order to operate at a useful resolution, preferably 16 to 20 bit resolution, and level of accuracy.

Embodiments of the present invention tackle one or more of the problems previously mentioned by providing the first power domain PWM pulse signal being synchronous with a system clock signal. In this way, it is possible to provide the high switching speeds with insignificant amounts of jitter.

Figure 1:
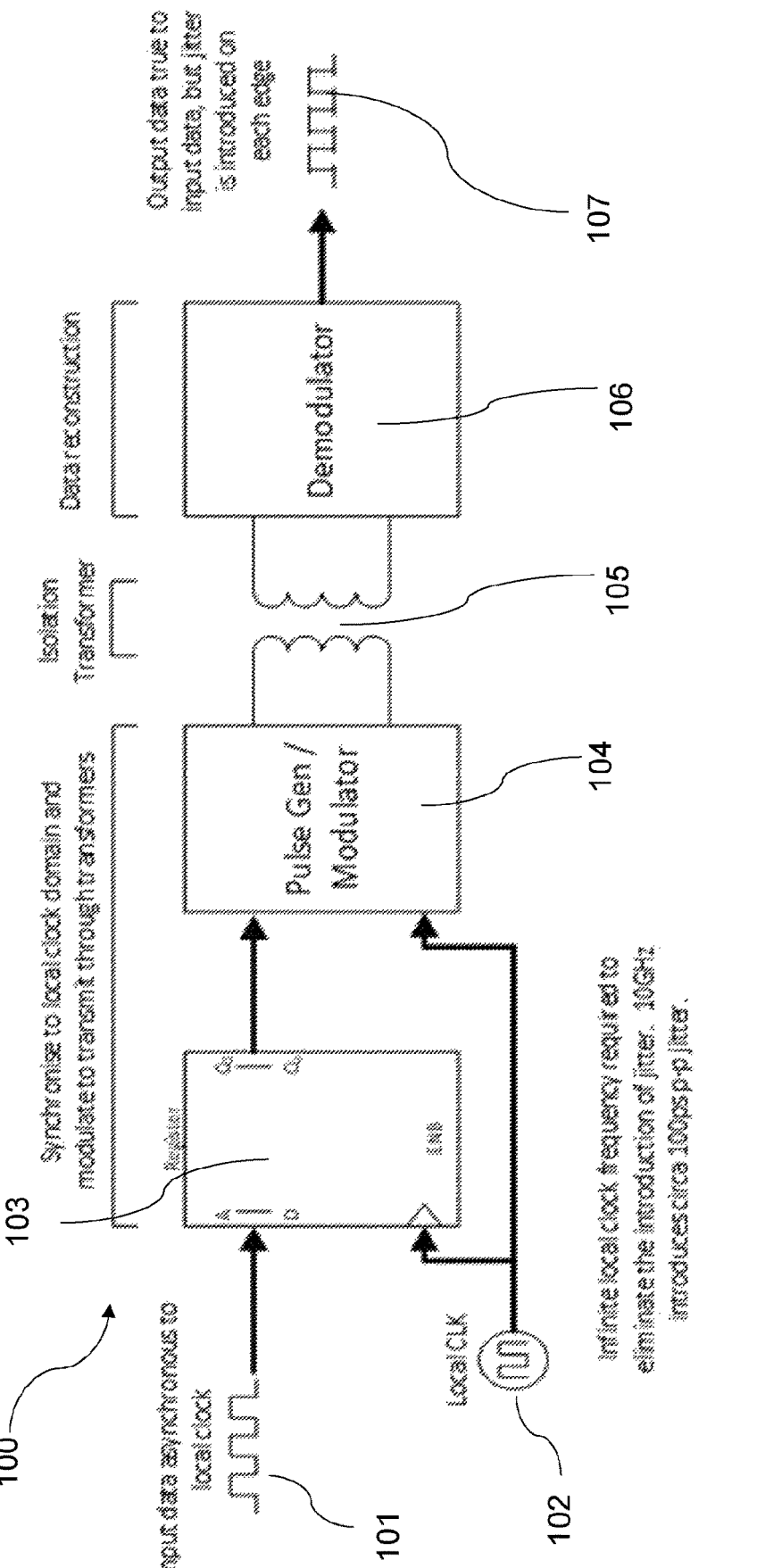
FIG. 1 schematically illustrates circuitry for driving a power switching device of the prior art.
Figure 2:
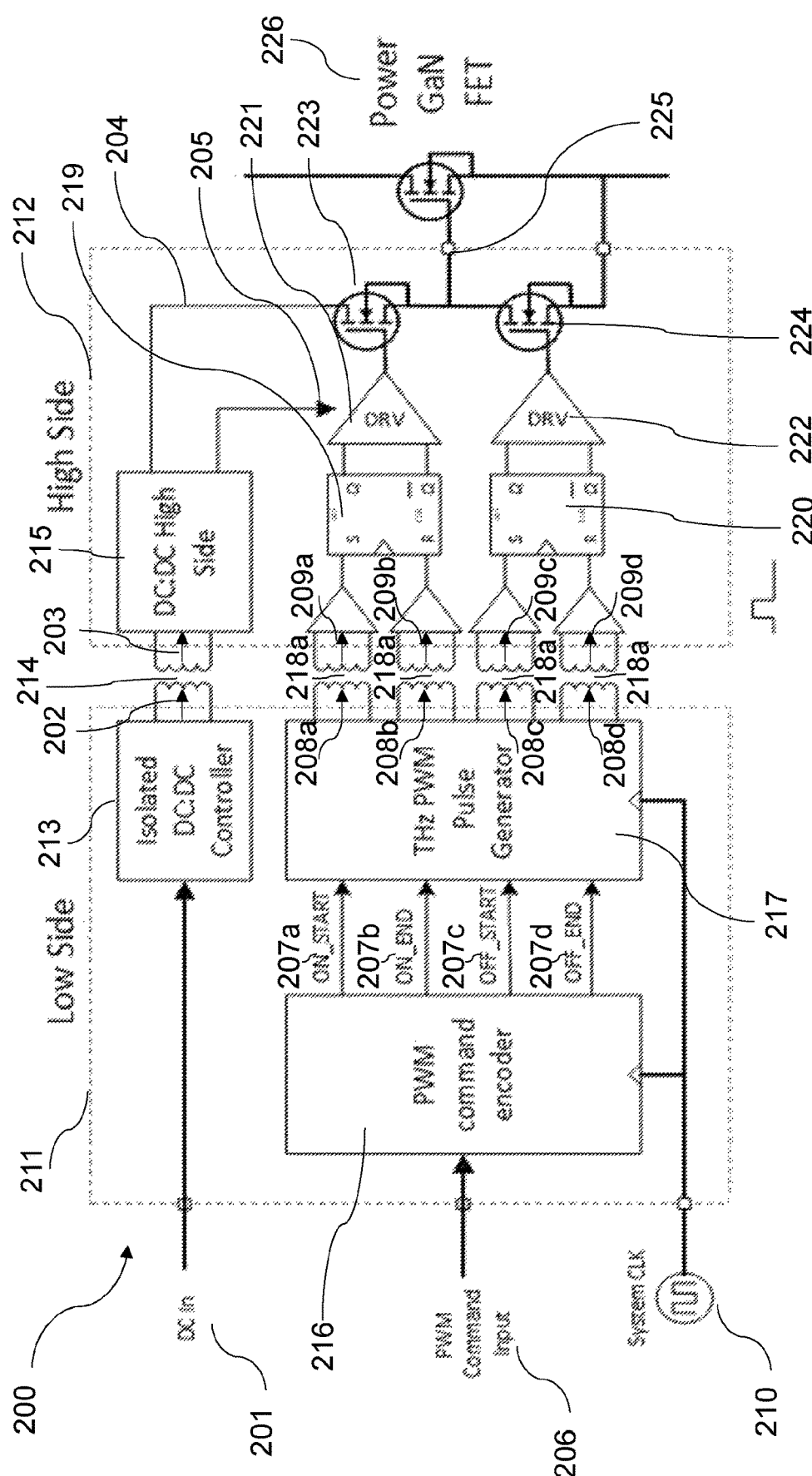
FIG. 2 schematically illustrates an exemplary embodiment of circuitry for driving a power switching device.

FIG. 2 schematically illustrates an exemplary embodiment of circuitry for driving a power switching device.

As shown in FIG. 2, the circuitry 200 comprises a control circuit 211, an isolation coupler 214, 218a, 218b, 218c, 218d and a drive circuit 212. The control circuit 211 is in a first power domain. The drive circuit 212 is in a second power domain. The isolation coupler 214, 218a, 218b, 218c, 218d is provided between the first power domain and the second power domain. The first power domain and the second power domain may have different power levels. For example, the second power domain may have a higher voltage than the first power domain. The isolation coupler 214, 218a, 218b, 218c, 218d provides a means for transferring power from the control circuit 211 to the drive circuit 212 while isolating the control circuit 211 and the drive circuit 212.

The control circuit 211 is configured to receive a first power domain voltage input 201. Preferably the first power domain voltage input 201 may comprise a DC power supply.

The control circuit 211 may comprise a first power domain isolated controller 213. The first power domain voltage input 201 may be received by the first power domain isolated controller 213 with an isolation barrier.

In some embodiments, the first power domain isolated controller 213 may also receive low speed configuration communications. In other words, the first power domain isolated controller 213 may receive both the first power domain voltage input 201 and the low speed communications concurrently, or over the same interface.

The control circuit 211 is configured to receive input command data 206. The input command data 206 may comprise a numerical representation of a PWM duty cycle. In other words, the input command data 206 may comprise the desired proportion of the time period, i.e. the pulse width, that a PWM signal should be active. The control circuit 211 may comprise a PWM command encoder 216. The input command data 206 may be inputted into the PWM command encoder 216.

The input command encoder 216 may generate PWM pulse data 207a, 207b, 207c, 207d by encoding the input command data 206. The PWM pulse data 207a, 207b, 207c, 207d encodes a PWM waveform. In other words, the PWM command encoder may use the received input command data 206, which comprises the numerical PWM duty cycle, and outputs the PWM pulse data 207a, 207b, 207c, 207d, which comprises the desired PWM waveform data for the PWM signal.

The PWM pulse data 207a, 207b, 207c, 207d may comprise ON data sets 207a, 207b representing an ON PWM waveform and OFF data sets 207c, 207d representing an OFF PWM waveform. The ON data sets 207a, 207b may comprise an ON_START data set 207a representing a start time of the ON PWM waveform and an ON_END data set 207b representing an end time of the ON PWM waveform. The OFF data sets 207c, 207d may comprise an OFF-_START data set 207c representing a start time of the OFF PWM waveform and an OFF_END data set 207d representing an end time of the OFF PWM waveform. There may be more than one ON_START, ON_END, OFF_START and OFF_END data set corresponding to the number of waves in the desired PWM waveform.

The control circuit 211 is configured to generate a first power domain PWM pulse signal 208a, 208b, 208c, 208d in response to receiving the PWM pulse data 207a, 207b, 207c, 207d. The first power domain PWM pulse signal 208a, 208b, 208c, 208d comprises a PWM pulse waveform. In other words, the PWM pulse data 207a, 207b, 207c, 207d comprises the desired PWM waveform data which defines the first power domain PWM pulse signal 208a, 208b, 208c, 208d. The control circuit 211 may comprise a PWM pulse generator 217. The PWM pulse data 207a, 207b, 207c, 207d may be inputted into the PWM pulse generator 217. The PWM pulse generator 217 may generate the first power domain PWM pulse signal 208a, 208b, 208c, 208d.

The control circuit 211 may be configured to generate a plurality of first power domain PWM pulse signals 208a, 208b, 208c, 208d corresponding to each PWM pulse data 207a, 207b, 207c, 207d. In this way, there may be ON 208a, 208b and OFF 208c, 208d first power domain PWM pulse signals, corresponding to the ON 207a, 207b and OFF 207c, 207d PWM pulse data sets.

Preferably the first power domain PWM pulse signals 208a, 208b, 208c, 208d have a low duty cycle such that the isolation coupler 214, 218a, 218b, 218c, 218d does not saturate. In embodiments in which the isolation coupler 214, 218a, 218b, 218c, 218d comprises one or more transformers, it is preferable that the transformer cores do not saturate.

The control circuit 211 is configured to receive a system clock signal 210. The system clock signal 210 may be received by the PWM command encoder 216 and the PWM pulse generator 210. The first power domain PWM pulse signal 208a, 208b, 208c, 208d is synchronous with the system clock signal 210. In other words, the first power domain PWM pulse signal 208a, 208b, 208c, 208d is generated directly from the PWM signal generator 217. Thus, the first power domain PWM pulse signal 208a, 208b, 208c, 208d are inherently synchronous to the system clock signal 210. In this way, the precision of the PWM signal generator 217 is the same as the system clock signal 210. In this embodiment, this may provide a sub-picosecond resolution of the first power domain PWM pulse signal 208a, 208b, 208c, 208d.

The PWM command encoder 216 may be a distinct functional unit. The PWM signal generator 217 may be a distinct functional unit. The first power domain PWM pulse signal 208a, 208b, 208c, 208d may be generated by the distinct functional PWM signal generator 217 unit.

In some embodiments, the first power domain PWM pulse signal 208a, 208b, 208c, 208d may provide short pulses to set and/or reset or clock an ON flip-flop 219 and an OFF flip-flop 220 drive circuitry 212. This may allow the generation of arbitrary length, or DC drive levels to an ON gate 223 and an OFF gate 224.

This may differ from the prior art, which does not directly synchronise the first power domain PWM pulse signal 208a, 208b, 208c, 208d with the system clock signal 210 and instead attempts to resynchronise with the internal clock 102 with the demodulator 106 on the other side of the isolation transformer 105. This feature of the prior art introduces a significant amount of jitter as the circuitry 200 is attempting to react to the fine timing of the PWM signal 101 and the clocking signal 102. By removing the resynchronisation stage in the demodulator 106, the invention may remove the resynchronisation jitter. In some embodiments, the total additive jitter may be around 1 ps.

The isolation coupler 214, 218a, 218b, 218c, 218d may be configured to receive the first power domain voltage input 202 from the first power domain isolated controller 213. The isolation coupler 214, 218a, 218b, 218c, 218d may generate a second power domain voltage input 203 in response to the first power domain voltage input 202. In other words, the isolation coupler 214, 218a, 218b, 218c, 218d generates the second power domain voltage input 203 in dependence on receiving the first power domain voltage input 202. However, the isolation barrier provided by the isolation coupler 214, 218a, 218b, 218c, 218d may mean that there is no direct electrical coupling between the first power domain voltage input 202 and the second power domain voltage input 203. The isolation barrier may provide a safety mechanism by decoupling the electrical load. As described herein, the second power domain may comprise the same or a higher voltage than the first power domain and thus the second power domain voltage input 203 may comprise the same or a higher voltage than the first power domain voltage input 202.

The isolation coupler 214, 218a, 218b, 218c, 218d may be configured to receive the first power domain PWM pulse signal 208a, 208b, 208c, 208d from the PWM pulse generator 217. The isolation coupler 214, 218a, 218b, 218c, 218d may generate a second power domain PWM pulse signal 209a, 209b, 209c, 209d in response to the first power domain PWM pulse signal 208a, 208b, 208c, 208d. In other words, the isolation coupler 214, 218a, 218b, 218c, 218d generate the second power domain PWM pulse signal 209a, 209b, 209c, 209d in dependence on receiving the first power domain PWM pulse signal 208a, 208b, 208c, 208d. However, the isolation barrier provided by the isolation coupler 214, 218a, 218b, 218c, 218d may mean that there is no direct electrical coupling between the first power domain PWM pulse signal 208a, 208b, 208c, 208d and the second power domain PWM pulse signal 209a, 209b, 209c, 209d. The isolation barrier may provide a safety mechanism by decoupling the electrical load. As described herein, the second power domain may comprise the same or a higher voltage than the first power domain and thus the second power domain PWM pulse signal 209a, 209b, 209c, 209d may comprise the same or a higher voltage than the first power domain PWM pulse signal 208a, 208b, 208c, 208d.

The isolation coupler 214, 218a, 218b, 218c, 218d may be configured to generate a plurality of second power domain PWM pulse signals 209a, 209b, 209c, 209d each in response to a corresponding first power domain PWM pulse signal 208a, 208b, 208c, 208d. In this way, there may be ON 209a, 209b and OFF 209c, 209d second power domain PWM pulse signals, corresponding to the ON 208a, 208b and OFF 208c, 208d first power domain PWM pulse signals.

The isolation coupler 214, 218a, 218b, 218c, 218d may comprise a plurality of isolation couplers 214, 218a, 218b, 218c, 218d. In this way, there may be an isolation coupler 214, 218a, 218b, 218c, 218d for each signal to be transferred over the isolation barrier. A voltage input isolation coupler 214 may be provided to generate the second power domain voltage input 203 in response to the first power domain voltage input 202. The PWM pulse signal isolation couplers 218a, 218b, 218c, 218d may be provided to generate each of the second power domain PWM pulse signals 209a, 209b, 209c, 209d in response to the first power domain PWM pulse signals 208a, 208b, 208c, 208d.

The isolation coupler 214, 218a, 218b, 218c, 218d may comprise at least one transformer. In embodiments comprising more than one isolation coupler 214, 218a, 218b, 218c, 218d there may be one transformer for each signal to be transferred over the isolation barrier.

Alternatively, the isolation coupler 214, 218a, 218b, 218c, 218d may comprise at least one AC coupling capacitor. AC coupling capacitors may not be as resilient to high dv/dt between the two power domains as transformers as the capacitors may require precise matching of the coupling capacitors to operate correctly. Although, a capacitor may be easier to implement than transformers in embodiments in which the circuitry 200 is entirely implemented in a single application-specific integrated circuits (ASIC).

The drive circuit 212 may be configured to receive the second power domain voltage input 203 from the isolation coupler 214, 218a, 218b, 218c, 218d. The drive circuit 212 may comprise a second power domain isolated controller 215. The second power domain isolated controller 215 may be configured to receive the second power domain voltage input 203. In some embodiments, the second power domain isolated controller 215 may be a slave to the first power domain isolated controller 213. In other words, the second power domain isolated controller 215 may controlled by the first power domain isolated controller 213.

The drive circuit 212, preferably the second power domain isolated controller 215, may be configured to generate a DC potential 204 from the second power domain voltage input 203. The DC potential 204 may be used generate a power switching device voltage input 225. The power switching device voltage input 225 may be used to drive a power switching device 226.

The power switching device 226 may be driven with the power switching device voltage input 225 in response to the second power domain PWM pulse signal 209a, 209b, 209c, 209d. In other words, the power switching device voltage input 225 may be provided to the power switching device 226 in dependence on the control provided by the second power domain PWM pulse signal 209a, 209b, 209c, 209d. The control may vary the level of the power switching device voltage input 225 and the whether the power switching device voltage input 225 is on or off.

As described herein, the second power domain PWM pulse signal 209a, 209b, 209c, 209d may comprise a plurality of second power domain PWM pulse signals 209a, 209b, 209c, 209d. Thus, the power switching device voltage input 225 may be provided to the power switching device 226 in dependence on the control provided by the plurality of second power domain PWM pulse signals 209a, 209b, 209c, 209d.

Preferably, the drive circuit 212 comprises an ON gate 223. The ON gate may be controlled by the ON second power domain PWM pulse signals 209a, 209b. The ON gate may open in response to the ON_START second power domain PWM pulse signal 209a. The ON gate may close in response to the ON_END second power domain PWM pulse signal 209b.

Preferably, the drive circuit 212 comprises an OFF gate 224. The OFF gate may be controlled by the OFF second power domain PWM pulse signals 209c, 209d. The OFF gate may open in response to the OFF_START second power domain PWM pulse signal 209c. The OFF gate may close in response to the OFF_END second power domain PWM pulse signal 209d.

The drive circuit 212 may be configured such that power switching device voltage input 225 may be pulled up to the DC potential 204 in response to the ON gate 223 closing. The drive circuit 212 may also be configured such that the power switching device voltage input 225 may be pulled down to the source potential in response to the OFF gate 224 closing. If the ON gate 223 is closed and the OFF gate is open, then the power switching device voltage input 225 may tend to a maximum. If the ON gate 223 is open and the OFF gate is closed, then the power switching device voltage input 225 may tend to a minimum. In this way, the closing and opening of the ON gate 223 and the OFF gate 224 may enable the power switching device voltage input 225 to be varied between 0% and 100% power level. The ON gate 223 and the OFF gate 224 may provide a push-pull pre-driver stage.

The ON gate 223 and the OFF gate 224 may be driven by an ON gate driver 221 and an OFF gate driver 222 respectively. The drive circuit 212 may provide a gate logic supply signal 205. The gate logic supply signal 205 may be used to provide logic to the ON gate driver 221 and an OFF gate driver 222.

The ON gate driver 221 and the OFF gate driver 222 may be controlled by an ON flip-flop 219 and an OFF flip-flop 220 respectively. The ON flip-flop 219 and the OFF flip-flop 220 may receive the second power domain PWM pulse signals 209a, 209b, 209c, 209d from the isolation couplers 218a, 218b, 218c, 218d. The second power domain PWM pulse signals 209a, 209b, 209c, 209d may be sent to the ON flip-flop 219 and the OFF flip-flop 220 with a 1-2 ns duty cycle. In this way, this may prevent the circuitry 200 from saturating as the circuitry 200 may have sufficient core flux reset time even with the preferable 10 to 100 MHz switching speed.

Additionally, by increasing the resilience of the circuitry 200 to saturation this may reduce the need for reset and timing limits checking. This may further reduce the complexity and jitter added to the circuitry 200.

By using the ON flip-flop 219 and an OFF flip-flop 220 in the drive circuit 212 this may enable the ON gate 223 and the OFF gate 224 to be driven statically. In other words, the power switching device 226 may be driven ON or OFF at any duty cycle from the minimum pulse width to DC. This pulse width may be in the region of 1 ns.

Comparatively, AC coupled control signals may not be able to generate DC signals as the AC coupling may not enable constant DC transmission. Although, the drive circuit 212 described herein, may allow AC signals (passed through AC coupled transformers) to generate DC or arbitrary duty cycle signals. In an embodiment in which the isolation coupler 214, 218a, 218b, 218c, 218d comprises one or more transformers, the use of high speed, short time constant transformers, which have low parasitic coupling between the windings, may allow the circuitry to be highly resilient to exceptionally high rates of dv/dt between the potentials seen by the control circuit 211 and the drive circuit 212.

For example, using conventional AC coupling to isolate the control circuit 211 from the drive circuit 212, the time constant of the transformer (the volt-second capability) may be increased to allow longer time constant signals to be passed through the transformer without core saturation. Higher volt-second transformers may have larger cores and more inductance in the windings and hence more coupling between the primary and secondary. This increased coupling may reduce the dv/dt tolerance of the circuitry 200. Thus, long time constant isolated drivers using AC coupling may not be possible, without significantly degrading the dv/dt tolerance of the circuitry.

The drive circuit 212 is in a second power domain. The second power domain may further comprise a first sub-power domain and a second sub-power domain. The first sub-power domain may comprise the pull up path, including the ON flip-flop 219, the ON gate driver 221, and the ON gate 223. The second sub-power domain may comprise the pull down path, including the OFF flip-flop 220, the OFF gate driver 222, and the OFF gate 224. The first sub-power domain and the second sub-power domain may have different power levels. For example, the first sub-power domain may have a higher voltage than the second sub-power domain. The first sub-power domain is preferably isolated from the second sub-power domain.

In this way, the first sub-power domain may be floated on a ground which is connected to the power switching device 226. The second sub-power domain may be floated on a different ground to the first sub-power domain. As there is no translation of the signals from the first sub-power domain to the second sub-power domain, there may be no need for a level shifter in the circuitry 200. The removal of the need for a level shifter may also increase the resilience to high dv/dt and may reduce the jitter, when compared to existing systems.

The circuitry 200 may be used to drive a plurality of power switching devices 226. This may enable multiple devices to the driven and controlled at the same level.

The power switching device 226 may comprise a transistor. Preferably, the power switching device is a field effect transistor (FET). More preferably, the FET is a gallium gallium nitride (GaN) FET. By driving a GaN FET this may enable a high switching speed, preferably in the range of 10 to 100 MHz. In combination with the reduced jitter provided by the synchronous circuitry 200, this may enable the output of the power switching device 226 to provide a sub-pico-second resolution.

The control circuit 211 and the drive circuit 212 may be implemented on separate application-specific integrated circuits (ASICs). Preferably, the separate ASICs for the control circuit 211 and the drive circuit 212 and the isolation coupler 214, 218a, 218b, 218c, 218d transformers are provided on a single encapsulated integrated circuit (IC) package.

Preferably, the transformer has a high isolation voltage and high dv/dt tolerance levels. This may be required to withstand the high-speed switching of a GaN FET.

Alternatively, if on-chip transformers are used, then the entire circuitry 200 may be provided on a single ASIC.

The circuitry 200, specifically the power switching device 226, or plurality of power switching devices 226, may be used to drive a power converter. By using the circuitry 200 as described herein, this may enable a high-resolution control for the power converter.

In particular, the circuitry 200, specifically the power switching device 226, or plurality of power switching devices 226, may be used to drive an electric motor. By using the circuitry 200 as described herein, this may enable a high-resolution control for the electric motor.

FIG. 3 summarises an example of a method 300 for driving a power switching device. At step 301, the method comprises generating a first power domain PWM pulse signal in response to received PWM pulse data, the first power domain PWM pulse signal being synchronous with a system clock signal. At step 302, the method comprises generating a second power domain PWM pulse signal in response to the first power domain PWM pulse signal. At step 303, the method comprises driving the power switching device with a voltage input in response to the second power domain PWM pulse signal.

The method 300 may be implemented on the circuitry 200 illustrated in FIG. 2 and described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description, it will be evident to a person skilled in the art that various modifications may be made within the scope of the invention.

The invention claimed is:

1. Circuitry configured to drive a power switching device, the circuitry comprising:
   a control circuit in a first power domain configured to generate a first power domain PWM pulse signal in response to received PWM pulse data that encodes a PWM waveform, the first power domain PWM pulse signal being synchronous with a system clock signal;
   an isolation coupler between the first power domain and a second power domain configured to generate a second power domain PWM pulse signal in response to the first power domain PWM pulse signal; and
   a drive circuit in the second power domain configured to drive the power switching device with a voltage input in response to the second power domain PWM pulse signal.

2. The circuitry according to claim 1, wherein the control circuit is configured to generate the PWM pulse data by encoding input command data, the input command data comprising a numerical representation of the PWM duty cycle.

3. The circuitry according to claim 1, wherein the PWM pulse data comprises ON data sets representing an ON PWM waveform and OFF data sets representing an OFF PWM waveform.

4. The circuitry according to claim 3, wherein the ON data sets comprise an ON_START data set representing a start time of the ON PWM waveform and an ON_END data set representing an end time of the ON PWM waveform, and the OFF data sets comprise an OFF_START data set representing a start time of the OFF PWM waveform and an OFF_END data set representing an end time of the OFF PWM waveform.

5. The circuitry according to claim 3, wherein the control circuit is configured to generate a plurality of first power domain PWM pulse signals, each first power domain PWM pulse signal being generated in response to a corresponding PWM pulse data set.

6. The circuitry according to claim 5, wherein the isolation coupler is configured to generate a plurality of second power domain PWM pulse signals, each second power domain PWM pulse signal being generated in response to a corresponding first power domain PWM pulse signal.

7. The circuitry according to claim 6, wherein the isolation coupler comprises a plurality of transformers, each transformer configured to generate a second power domain PWM pulse signal of the plurality of second power domain PWN pulse signals.

8. The circuitry according to claim 6, wherein the drive circuit is configured to drive the power switching device with the voltage input in response to the plurality of second power domain PWM pulse signals.

9. The circuitry according to claim 6, wherein the drive circuit comprises an ON gate, the ON gate closing in response to an ON_START second power domain PWM pulse signal and opening in response to an ON_END second power domain PWM pulse signal.

10. The circuitry according to claim 9, wherein the voltage input to the power switching device increases in response to the ON gate closing.

11. The circuitry according to claim 9, wherein the second power domain comprises a first sub-power domain and a second sub-power domain.

12. The circuitry according to claim 11, wherein the ON gate is located in the first sub-power domain and the OFF gate is located in the second sub-power domain.

13. The circuitry according to claim 6, wherein the drive circuit comprises an OFF gate, the OFF gate closing in response to an OFF_START second power domain PWM pulse signal and opening in response to an OFF_END second power domain PWM pulse signal.

14. The circuitry according to claim 13, wherein the voltage input to the power switching device decreases in response to the OFF gate closing.

15. The circuitry according to claim 1, wherein the isolation coupler comprises at least one transformer.

16. The circuitry according to claim 1, wherein the control circuit is configured to receive a first power domain voltage input, the isolation coupler is configured to generate a second power domain voltage input in response to the first power domain voltage input, and the drive circuit is configured to generate a power switching device voltage input from the second power domain voltage input, the power switching device voltage input being used to drive the power switching device.

17. The circuitry according to claim 1, wherein: the circuitry comprises a plurality of power switching devices driven by the drive circuit, and wherein the plurality of power switching devices comprises a transistor and/or a field effect transistor.

18. A power converter assembly comprising a power converter driven by the circuitry of claim 1.

19. An electric motor assembly comprising an electric motor driven by the circuitry of claim 1.

* * * * *